(12) United States Patent
Nah et al.

(10) Patent No.: US 11,541,472 B2
(45) Date of Patent: Jan. 3, 2023

(54) ULTRASONIC-ASSISTED SOLDER TRANSFER

(71) Applicant: International Business Machines Corporation, Armonk, NY (US)

(72) Inventors: Jae-Woong Nah, Closter, NJ (US); Stephen L. Buchwalter, Anthem, AZ (US); Peter A. Gruber, Mohegan Lake, NY (US); Paul Alfred Lauro, Brewster, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 422 days.

(21) Appl. No.: 16/775,390

(22) Filed: Jan. 29, 2020

(65) Prior Publication Data

US 2021/0229203 A1 Jul. 29, 2021

(51) Int. Cl.
*B23K 3/00* (2006.01)
*B23K 1/06* (2006.01)
(Continued)

(52) U.S. Cl.
CPC .............. *B23K 1/06* (2013.01); *B23K 1/0016* (2013.01); *B23K 3/0607* (2013.01); *H01L 24/75* (2013.01);
(Continued)

(58) Field of Classification Search
CPC .... B23K 1/06; B23K 1/0016; B23K 2101/40; B23K 2103/30; B23K 2103/54;
(Continued)

(56) References Cited

U.S. PATENT DOCUMENTS

| 3,084,650 | A | * | 4/1963 | Johns | ................... | B23K 3/0661 |
| | | | | | | 228/180.1 |
| 6,454,154 | B1 | * | 9/2002 | Pedigo | ................. | H05K 3/4053 |
| | | | | | | 228/256 |

(Continued)

OTHER PUBLICATIONS

Wei Cui, Chunyu Wang, Yuhang Li, Tongtong Zhong, Jianguo Yang and Yefeng Bao, Ultrasonic-Assisted Soldering of Cu/Ti Joints, 2018; IOP Conf. Ser.: Mater. Sci. Eng. 322 022020 URL: http://iopscience.iop.org/article/10.1088/1757-899X/322/2/022020/pdf.

(Continued)

*Primary Examiner* — Kiley S Stoner
(74) *Attorney, Agent, or Firm* — Daniel P. Morris; Erik Johnson; Lou Percello, Attorney, PLLC

(57) ABSTRACT

Apparatus and methods are disclosed for transferring solder to a substrate. A substrate belt moves one or more substrates in a belt direction. A decal has one or more through holes in a hole pattern that hold solder. Each of the solder holes can align with respective locations on one of the substrates. An ultrasonic head produces an ultrasonic vibration in the solder in a longitudinal direction perpendicular to the belt direction. The ultrasonic head and substrate can be moved together in the longitudinal direction to maintain the ultrasonic head in contact with the solder while the ultrasonic head applies the ultrasonic vibration. Various methods are disclosed including methods of transferring the solder with or without external heating.

12 Claims, 6 Drawing Sheets

(51) Int. Cl.
*H01L 23/00* (2006.01)
*B23K 1/00* (2006.01)
*B23K 3/06* (2006.01)
*B23K 103/00* (2006.01)
*B23K 101/40* (2006.01)

(52) U.S. Cl.
CPC .......... *H01L 24/81* (2013.01); *B23K 2101/40* (2018.08); *B23K 2103/30* (2018.08); *B23K 2103/54* (2018.08); *H01L 2224/75353* (2013.01); *H01L 2224/75651* (2013.01); *H01L 2224/75755* (2013.01); *H01L 2224/81054* (2013.01); *H01L 2224/81139* (2013.01); *H01L 2224/81207* (2013.01); *H01L 2224/81815* (2013.01); *H01L 2924/014* (2013.01); *H01L 2924/0105* (2013.01); *H01L 2924/01029* (2013.01); *H01L 2924/01047* (2013.01); *H01L 2924/01049* (2013.01); *H01L 2924/01082* (2013.01); *H01L 2924/01083* (2013.01)

(58) Field of Classification Search
CPC ........ B23K 1/00–206; B23K 3/00–087; B23K 20/10–106; H01L 24/75; H01L 24/81; H01L 2224/75353; H01L 2224/75651; H01L 2224/75755; H01L 2224/81054; H01L 2224/81139; H01L 2224/81207; H01L 2224/81815; H01L 2924/01029; H01L 2924/01047; H01L 2924/01049; H01L 2924/0105; H01L 2924/01082; H01L 2924/01083; H01L 2924/014
USPC .............. 228/1.1, 110.1, 245–262, 215–216, 228/15.1–23, 33–43
See application file for complete search history.

(56) References Cited

U.S. PATENT DOCUMENTS

| | | | |
|---|---|---|---|
| 7,867,842 | B2 | 1/2011 | Gruber et al. |
| 7,928,585 | B2 | 4/2011 | Buchwalter et al. |
| 7,980,446 | B2 * | 7/2011 | Buchwalter .............. B23K 3/08 |
| | | | 228/256 |
| 8,800,846 | B2 | 8/2014 | Nikkhoo |
| 2005/0102823 | A1 * | 5/2005 | Kim ...................... H01H 69/02 |
| | | | 29/874 |
| 2006/0035454 | A1 * | 2/2006 | Belanger ................. H01L 24/11 |
| | | | 257/E21.508 |
| 2006/0091184 | A1 | 5/2006 | Bayot et al. |
| 2008/0176393 | A1 * | 7/2008 | Mackay ............... B23K 1/0016 |
| | | | 257/E21.508 |
| 2008/0302863 | A1 * | 12/2008 | Zakel ................... H05K 3/3478 |
| | | | 228/41 |
| 2011/0092066 | A1 | 4/2011 | MacKay |
| 2014/0166730 | A1 | 6/2014 | Taylor et al. |
| 2015/0174678 | A1 * | 6/2015 | Sato ......................... C23C 2/04 |
| | | | 228/40 |

OTHER PUBLICATIONS

Ultrasonic Soldering Method & Theory Bonding to Unbondable Materials: Deliveredd by Ultrasonic Wave, Japan Unix; URL: https://www.japanunix.com/en/method/ultrasonic/.

Changhai Wang, Andrew S. Holmes; Laser-Assisted Bumping for Flip Chip Assembly; IEEE Transactions on Electronics Packaging Manufacturing, May 2001; URL: https://www.researchgate.net/pubiication/3424915/download.

Jihye Lee, Jung H. Kim, and Choong D. Yoo, Thermosonic Bonding of Lead-Free Solder with Metal Bump for Flip-Chip Bonding; Mechanical Engineering Department, KAIST, Daejeon, 305-701 Korea 3210.

* cited by examiner

ULTRASONIC-ASSISTED SOLDER TRANSFER

BACKGROUND

The present invention relates to transferring solder contacts onto semiconductor substrates. More specifically the invention relates to ultrasonic- or thermosonic-assisted solder transfer to semiconductor substrates.

Existing systems and methods, e.g. Injection Molded Soldering (IMS) techniques, transfer solder contacts to substrates. These techniques use decals, e.g. flexible "ribbon-like" material, with feature holes or anchor holes that are filled with solder. The solder-filled holes are positioned over substrates at some point in the process.

In some embodiments, the decal and substrate are compressed (thermally compressed) together to a point where the solder reflows to attach to locations, e.g. contact pads, on the substrates. The temperature increases due to the thermal compression. This process step can occur in a heated environment to aid the solder reflow. After some cooling the decal is removed, leaving the reflowed solder, e.g. solder balls, physically and electrically attached to the substrates.

In other embodiments, the decal and substrate are compressed together (compression) in a higher temperature environment where the solder is heated slightly over the melting point of the specific solder material. In this environment, the higher temperature is primarily responsible for the solder reflow. After some cooling the decal is removed, as before.

In both these embodiments, the temperature environment is increased to cause the solder reflow. Then the temperature decreases to a point when the decal is removed. These temperature changes, e.g. thermal cycling, can cause stresses on the substrate and the substrate internals, e.g. layers, circuitry, and components within the substrate.

Also, chemical changes and other physical changes can occur to the substrate and substrate internals as a result of the amount and rate of temperature cycling. For example, the temperature cycling can cause internal contacts to move or break. Temperature cycling can also cause migration of materials to deteriorate components and/or connections. Even slight incipient movement, flaw, and/or material changes can diminish performance, reduce product yields, or lead to early substrate failures, in later stages of assembly and/or operation.

There is a need for improved manufacturing apparatus and methods of manufacture to produce devices with reduced or no temperature cycling during the transfer of solder.

SUMMARY

Non-limiting embodiments of the present invention include apparatus and methods for transferring solder to a substrate. A substrate belt can move one or more substrates in a belt direction. A decal has one or more through-holes in a hole pattern, each of the holes having a solder volume capable of holding a solder. Each of the solder volumes can align with respective locations on the substrates. An ultrasonic head can produce an ultrasonic vibration in the solder in a longitudinal direction. (The longitudinal direction is substantially perpendicular to the belt direction). The ultrasonic head and substrate can be moved together in the longitudinal direction to maintain the ultrasonic head in contact with the solder while the ultrasonic head applies the ultrasonic vibration. Various methods are disclosed including methods of transferring the solder with or without external heating.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

DETAILED DESCRIPTION

Figure 1:
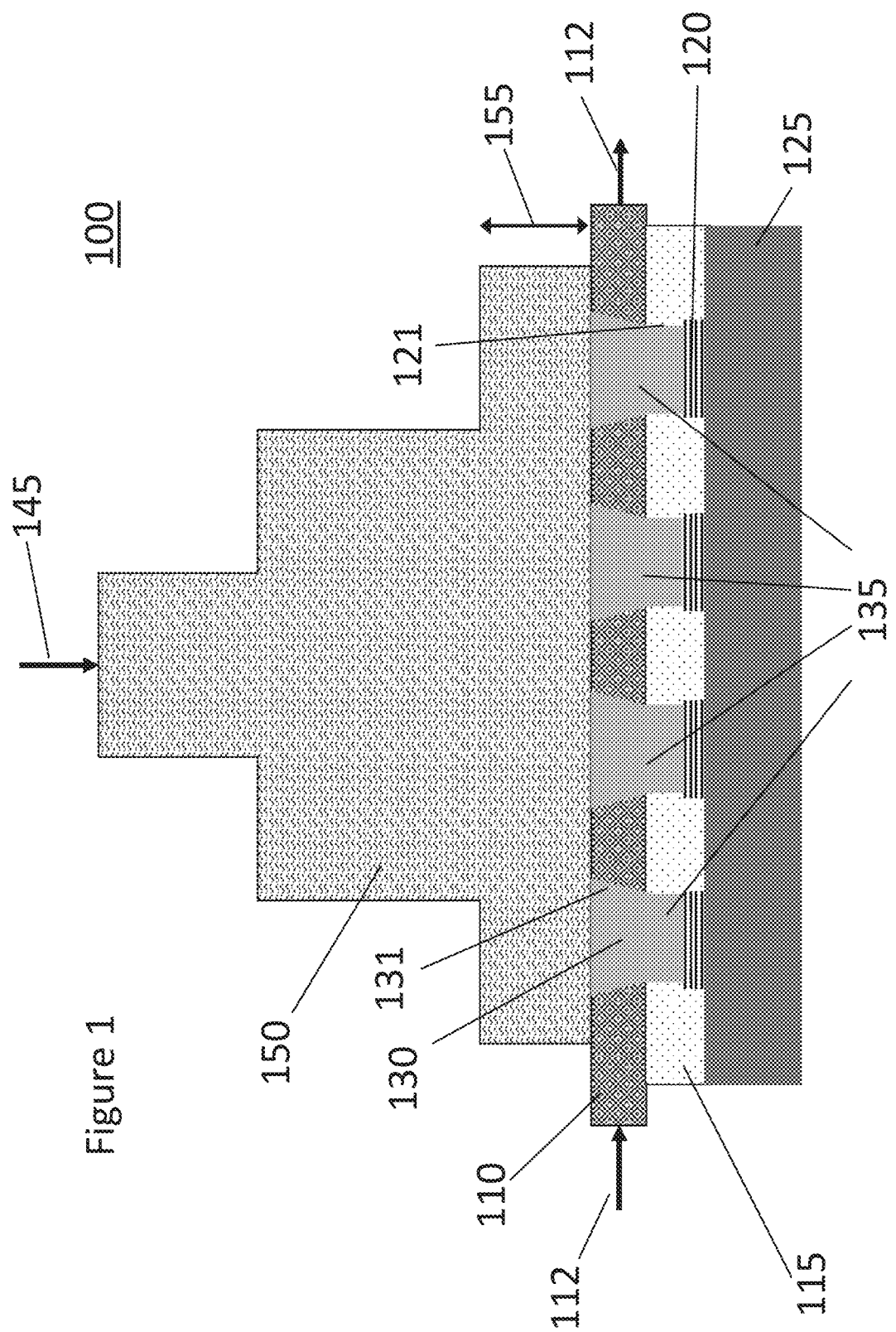
FIG. 1 is a block diagram of an ultrasonic-assisted solder transfer apparatus and process during transfer of solder to a substrate.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems for implementing embodiments of the invention may include, but are not limited to, use in personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures disclosed are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," "side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

FIG. 1 is a block diagram of an ultrasonic-assisted solder transfer apparatus and process 100 with external heat either applied or not during transfer of solder to a substrate.

Ultrasonic head 150 is a device capable of delivering high frequency vibration 145 energy in the form of ultrasonic vibration 145 in a longitudinal direction 155, i.e., a direction perpendicular to one or more substrates 125. Commercially available devices like ultrasonic horns 150 can be used as ultrasonic heads 150. The high frequency vibration 145 has a frequency between 10 kilohertz (khz) and 75 khz, or more particularly between 20 khz and 60 khz.

A decal 110 carries a solder volume 130 of solder 130 in each of the decal holes 131. The solder 130 is in an array or pattern that is positioned between the ultrasonic head 150 and one or more substrates 125, e.g. semiconductor chips.

The array/pattern of solder 130 filled decal holes 131 is aligned over the substrate 125 as the ultrasonic head 150 moves in a longitudinal direction 155 to the substrate 125. The ultrasonic head 150 compresses each of the solid solder 130 volumes in the array onto a respective location on the substrate 125.

In some embodiments, the locations on the substrate 125 are conductive pads 120, e.g. made of a conductive metal like copper. In some embodiments, a substrate layer 115 is disposed on the substrate 125 surface. The substrate layer 115 has openings 121 exposing the pads 120 and providing a volume in which the solder 130 can flow. The thickness of the substrate layer 115 and the depth of the openings 121 is around 15 to 25 microns.

While the ultrasonic head 150 is in contact with the solder 130 and is compressing the solder 130 onto the substrate 125, e.g. pads 120, the ultrasonic vibration 145 is applied. The ultrasonic vibration 145 causes the solder 130 to heat up, melt, and flow (reflow) onto the substrate locations, e.g. pads 120. After the reflow, the ultrasonic head 150 moves in the longitudinal direction 155 away from the substrate 125 to disengage from the substrate 125. After cooling, the solder becomes electrically and physically attached to the substrate 125 (e.g. pads 120) and the decal 110 can separate from the solder 130.

The decal 110 and substrate 125 move in direction 112 out from under the ultrasonic head 150 and the decal 110 delivers another array of solder 130 under the ultrasonic head 150 to repeat the process for the next substrate 125 delivered.

The ultrasonic vibration 145 causes heating primarily in the solder 130 and therefore the thermal cycling of the substrate 125 is greatly minimized. Accordingly, physical and chemical deterioration of the substrate 125 itself is reduced by this apparatus and process 100.

The ultrasonic vibration 145 enables the solder 130 to melt (reflow) and wet the surface of the pads 120 within 1 to 3 seconds. In some embodiments, no outside heat source is required and no external heating of the substrate 125 is done. The solder 130 and the holes 131 can be different shapes.

Figure 2:
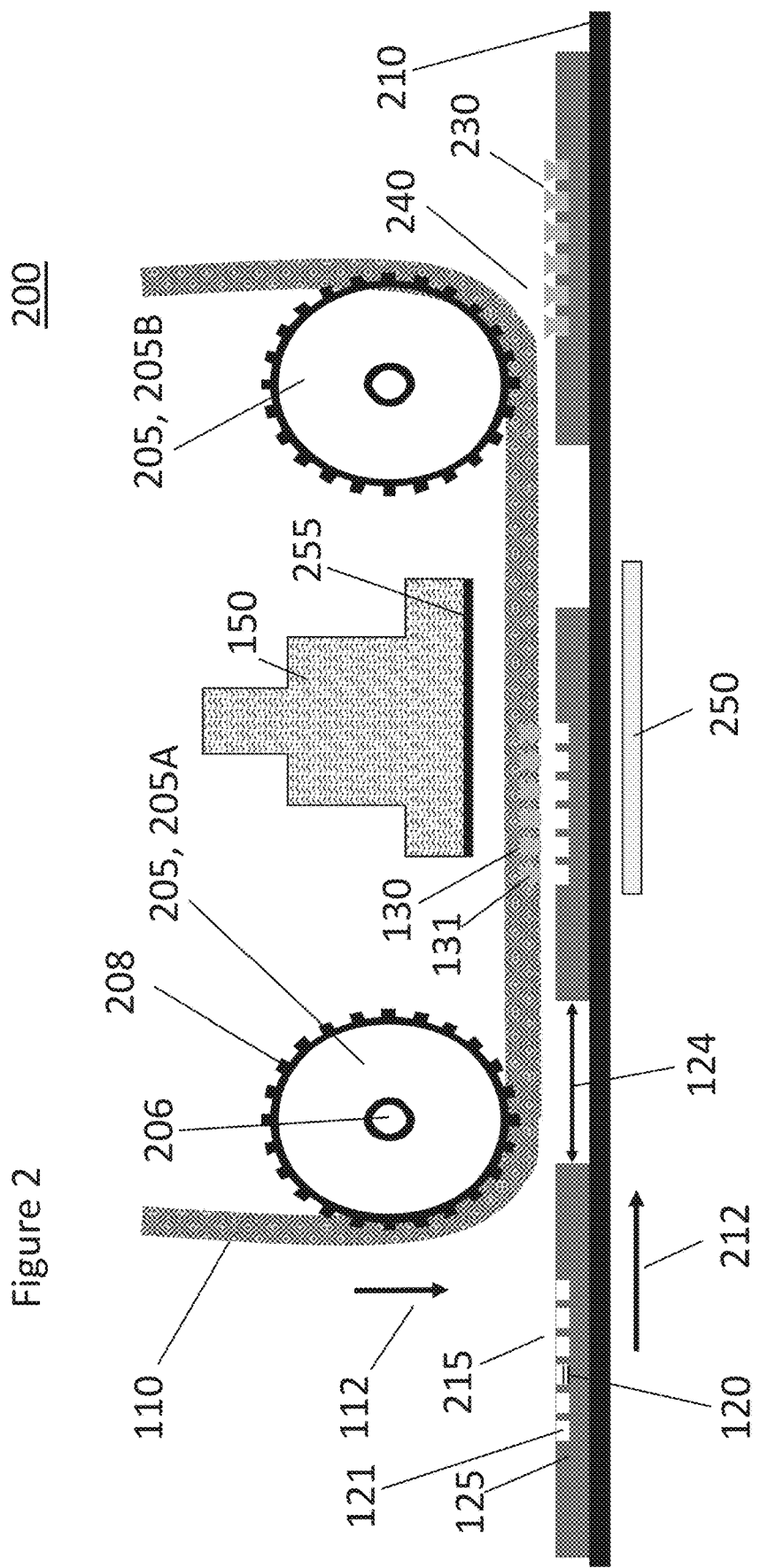
FIG. 2 is a block diagram of one automated embodiment of an ultrasonic-assisted solder transfer apparatus and process before longitudinal ultrasonic vibration is applied.

FIG. 2 is a block diagram of one automated embodiment of an ultrasonic-assisted solder transfer apparatus and process 200 before longitudinal 155 ultrasonic vibration 145 is applied.

The apparatus 200 has decal reels 205 each rotating about a reel axis 206. Decal reel 205B is a drive reel rotating so that the decal 110 is pulled through the apparatus as the decal 110 unrolls from or is guided through decal feed reel 205A. The decal reels 205 can have sprockets 208 on their circumference to grip feed holes (not shown) in the decal 110 to move the decal 110 in direction 112 through the apparatus 200.

The decal 110 is a flexible "ribbon-like" material that has a series of through hole 131 patterns or arrays, e.g. containing solder 130, passing through the decal 110. The decal 110 through hole 131 patterns/arrays can be created by mechanical punches, laser penetration, or chemical etching methods. The decal 110 can be made from polyamide, rubber, Teflon™, metal foil, etc. The holes 131 are filled with solder 130, e.g. by fill heads (not shown), by known injection molding techniques in a prior step in the process.

After the decal 110 moves from the decal feed reel 205A, the decal 110 passes between the ultrasonic head 150 and the substrates 125.

A substrate belt 210 holds a plurality of substrates 125. Each substrate 125 is spaced at a substrate distance 124 from the next substrate 125 on the substrate belt 210. The substrate belt 210 is driven by known methods, e.g. substrate belt rollers (not shown), in the belt direction 212. When the decal 110 and substrate belt 210 are under the ultrasonic head 150, the directions 112 and 212 are the same and parallel. A pressure plate 250 can be used to maintain pressure from the ultrasonic head 150 on the solder 130 when the ultrasonic head 150 moves to compress the sol 30 on the substrate 125 surface, e.g. to fill the openings 121 above the pads 120.

One or more substrates 125 at a time can be physical contact with the decal 110 when the ultrasonic head 150 engages. In some embodiments, the ultrasonic head 150 moves down to engage the substrate. In other embodiments, the substrate pressure plate 250 pushes on the substrate belt 210 to force and maintain contact between one or more substrates 125 against the ultrasonic head 150.

After the ultrasonic head 150 disengages from the substrate 125 and the reflowed solder 130 cools, the substrate belt 210 moves the substrate 125 to a point where the decal 110 separates 240 from the substrate and leaves solder contacts 230, e.g. solder balls electrically and physically attached to the substrate 125. The holes 131 in the decal 110 are now emptied of solder 130 and the decal 110 rolls onto the drive reel 205. In some embodiments, the size of the solder balls 230 deposited is between 10 microns and 500 microns.

In some embodiments, the process 200 is performed in a Nitrogen environment.

The substrate 125 can be a semiconductor chip or chip package, an organic substrate, a printed circuit board (e.g. an organic printed circuit board), a glass layer, a doped semiconductor, etc. In some embodiments, the substrate 125 does not have a substrate layer 115 (as shown in FIG. 1). Instead, surface openings 215 are in the surface of the substrate 125. The pads 120 are at the bottom of the surface openings 215.

Once the process 200 is completed for all the substrates 125 and the decal 110 holes 131 are empty of solder, the decal 110 can be reused. For example, the drive roll 205B can be returned to the solder fill step and then reloaded into now empty drive roll 205A and the process continued.

In an alternative embodiment, a compliant layer 255 of material is attached to the bottom of the ultrasonic head 150. This compliant layer 255 improves transfer of solder 130 from the decal/flexible film 210 to the substrates 125 when the rigid substrates 125 are warped. The compliant layer 255 helps apply a more uniform pressure on the array of solder, even though the surface of the substrate 125 is uneven due to the warpage.

The compressive force holding the solder 130 and pads 120 on the substrate 125 together is between 1 and 1000 grams of force. The vibration frequency can vary between 10 and 70 khz for 0.1 to 5 seconds.

Figure 3:
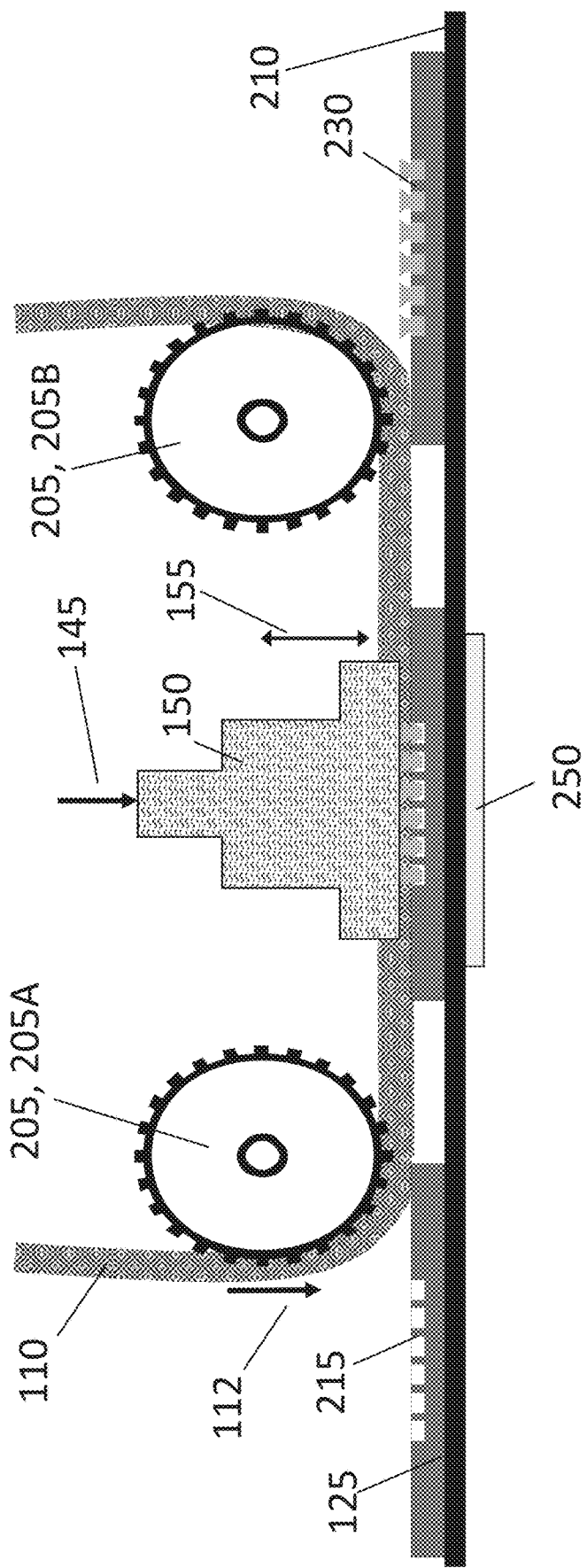
FIG. 3 is a block diagram of one automated embodiment of an ultrasonic-assisted solder transfer apparatus and process while longitudinal ultrasonic vibration is applied to transfer solder to a substrate.

FIG. 3 is a block diagram showing the bonding head 150 engaged on the decal 210 and substrate 125 in a bonding step performed by one automated embodiment of ultrasonic-assisted solder transfer apparatus and process of FIG. 2 and Process 200. In these embodiments, no external heat is applied. In this step 300, only longitudinal ultrasonic vibration 145 is applied to transfer solder 130 to a substrate 125.

The ultrasonic head 150 is engaged, i.e. in contact with the solder 130, and applies ultrasonic vibration 145 in the longitudinal direction 155. The ultrasonic head 150 and/or the pressure plate 250 have moved together so the ultrasonic head 150 applies pressure on the solder 130 while the ultrasonic vibration 145 is applied.

Figure 4:
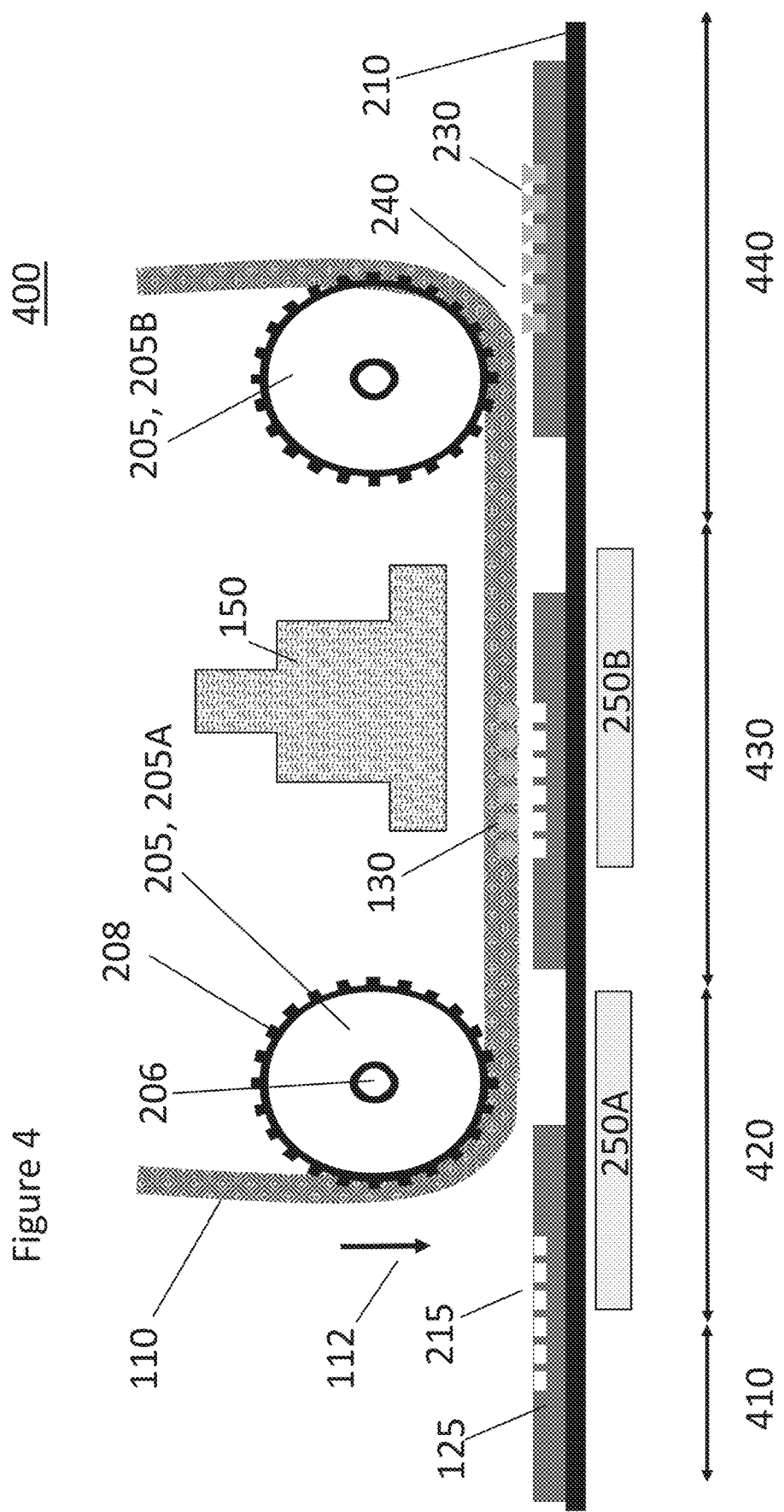
FIG. 4 is a block diagram of an alternative ultrasonic-assisted solder transfer apparatus and process with some external pre-heating applied before the ultrasonic energy transfers solder to a substrate.

FIG. 4 is a block diagram of an alternative ultrasonic-assisted solder transfer apparatus and process 400 with external pre-heating applied (420, 430) and alignment done before ultrasonic energy 145 transfers solder 130 to a substrate 125.

In this embodiment, while external heat is applied to the substrates 125, the external heat applied is below the amount that would cause temperature changes and/or temperature cycling of the substrates that cause physical or chemical changes to the substrates 125. For example, the external heat applied would keep the temperatures of the substrates 125 below 110 to 220 degrees Celsius.

The substrate belt 210 begins delivering substrates 125 through a warming region 410 with little or no external heat added. In some embodiments, the ambient temperature can be raised to add heat in this region.

In some embodiments, the substrate belt 210 continues moving the substrates 125 through a moderate heat region 420 where some amount of heat is added. This can be accomplished by placing a moderate heating plate 250A in the moderate heat region 420. The moderate heating plate 250A can include a resistive heating element that increases the temperature of the substrate 125 to make the entire temperature cycling of the substrate 125 more gradual.

In a heated region 430, a maximum amount of heat is added to the substrate just before and during the time the ultrasonic head engages with the solder 130 and substrate 125. The heat can be added by a heating plate 250B, e.g. with a resistive heating element, that has a temperature controlled at a higher set point than that of the element 250A in the moderate heat region 420. The maximum substrate 125 temperature reached in the heated region 430 caused by external heating will be below the melting point of the solder 130.

After the solder 130 reflows, the substrate belt 210 continues to move the substrate 125 into a cooling region 440 where neither heat nor ultrasonic vibration 145 is applied and the reflowed solder cools to form the solder contacts 230, e.g. solder balls.

Many variations of external heating are envisioned. In some embodiments, external heat is only added at the point where ultrasonic vibration 145 is applied. In other embodiments, there are no heating plates and the external heat is provided by raising the ambient temperature of regions 410, 420, 430, and even 440. The heat applied from the heating plates (250A, 250B) can be constant, pulsing, or ramping. Heating elements can be placed in the substrate belt 210 and controlled to change the substrate 125 temperature by a step increase, pulsing, and/or ramping.

In some embodiments, only enough heat is added to keep the substrate temperature below a design temperature below which no physical or chemical changes will occur within the substrate 125. The design temperature is chosen specific to each substrate 125 design. In no case is external heat added to bring the solder 130 above its melting point.

Raising the temperature of the solder 130 with external heat reduces the amount of ultrasonic vibration 145 applied to cause the solder 130 to reflow. For example, using a Tin-Silver-copper alloy solder 130 (with a melting temperature of 221 degrees Celsius), a maximum preheat temperature of 210 degrees Celsius could be applied.

Non-limiting example solders 130 that can be used include: lead-tin, In, Sn, InSn, InBiSn, SnBi, InAg, SnCu, SnAg, SnAgCu, and SnPb.

In the warming region 410 temperatures can vary from ambient temperature to 60 degrees Celsius, in the moderate heating region 420 temperatures can vary from 60 to 150 degrees Celsius, and in the heated region temperatures can vary between 100 and 220 degrees Celsius, 10 degrees Celsius cooler than the melting point of the solder 130.

Figure 5:
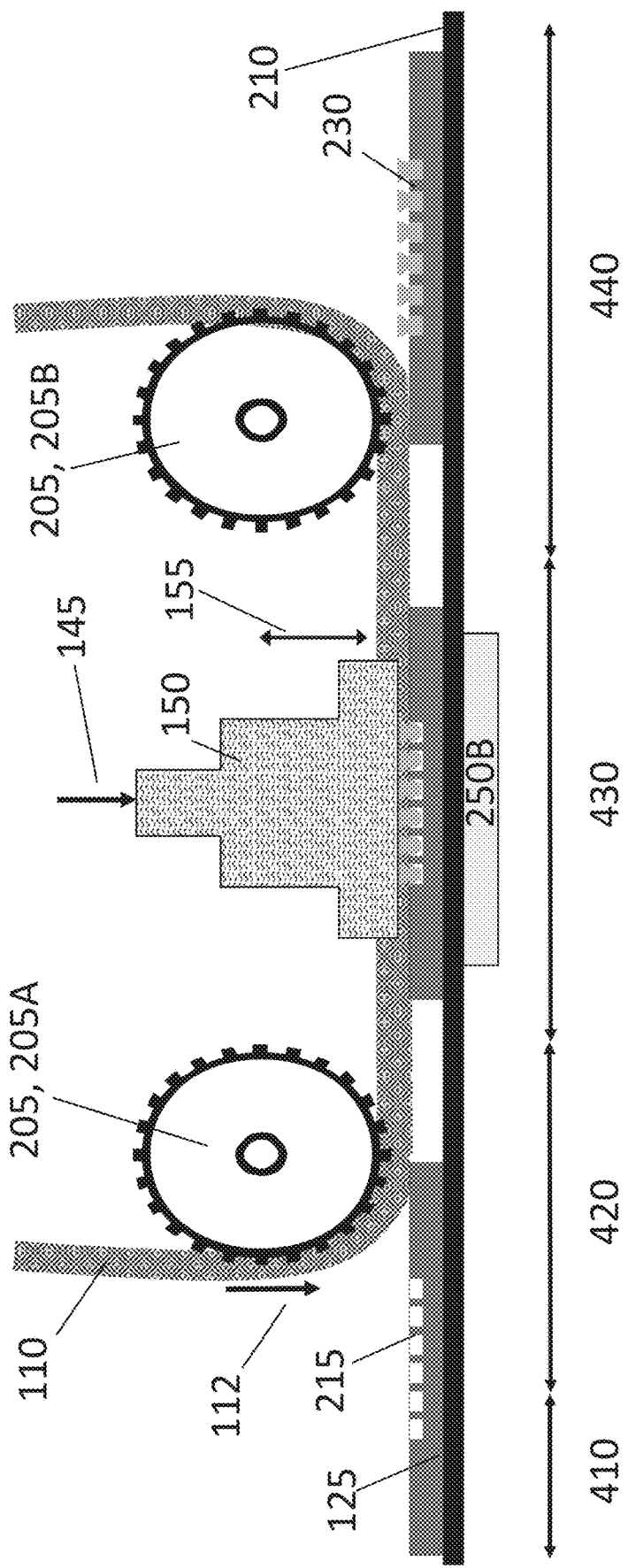
FIG. 5 is a block diagram of an alternative ultrasonic-assisted solder transfer apparatus and process with some external pre-heating applied while a lower amount of ultrasonic energy transfers solder to a substrate.

FIG. 5 is a block diagram of an alternative ultrasonic-assisted solder transfer apparatus and process 500 with external pre-heating applied 250B while a lower amount of ultrasonic energy 145 transfers solder to a substrate 125.

The ultrasonic head 150 is engaged with the substrate 125 while external heat 250B and ultrasonic vibrations 145 are simultaneously applied. Alternative external heating strategies, as described in FIG. 4, can be applied in regions 410 and 420.

Figure 6:
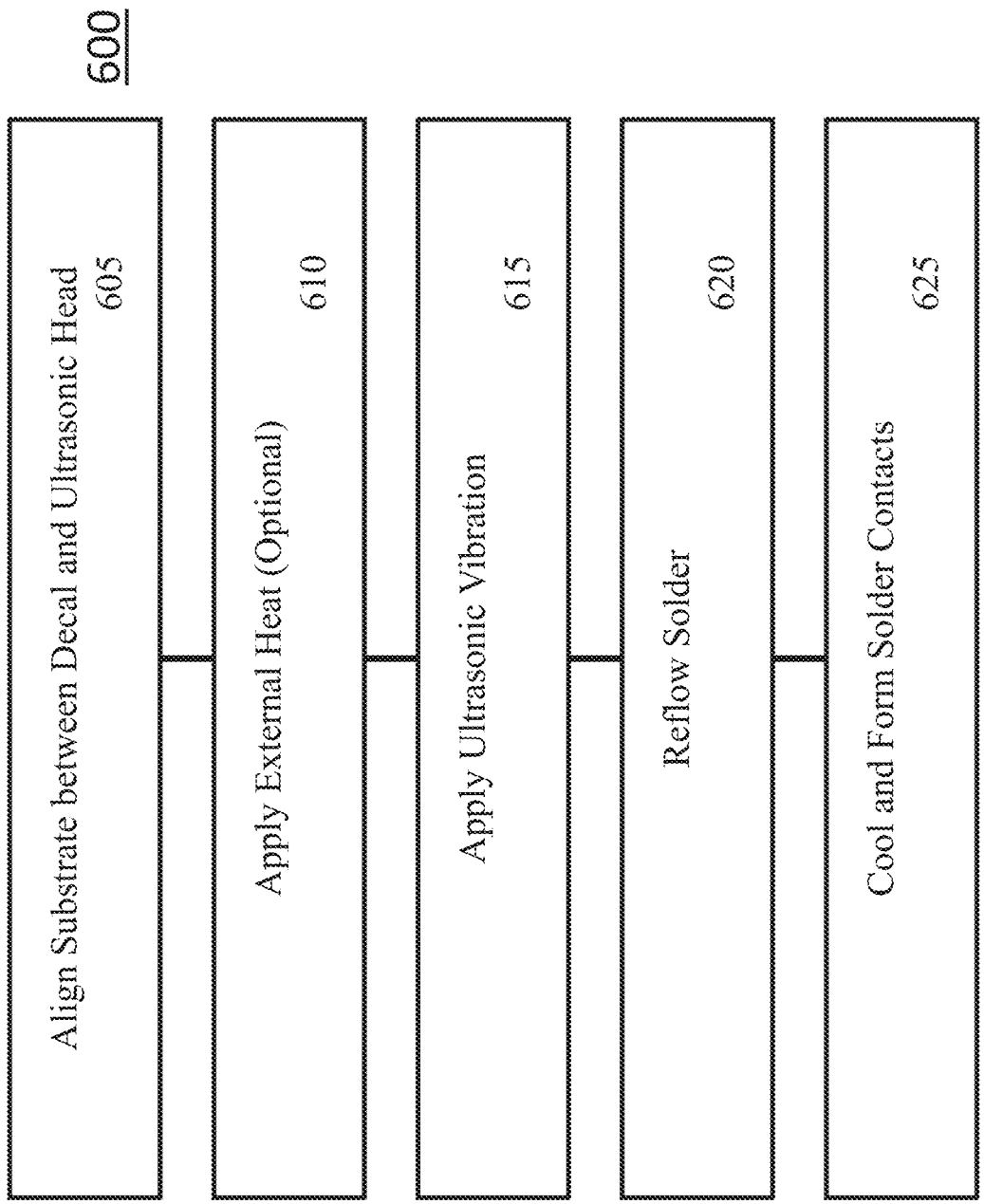
FIG. 6 is a flow chart with process steps for transferring solder to one or more substrates using ultrasonic vibrations.

FIG. 6 is a flow chart of a process 600 showing steps for transferring solder 130 to one or more substrates 125 using ultrasonic vibrations 145.

Step 605 begins the process 600 with aligning an array or pattern of solder 130 on a decal 110 between a substrate 125 and an ultrasonic head 150. The solder 130 is compressed between ultrasonic head 150 and the substrate 125.

Step 610 is an optional step of applying external heat to the substrate 125 as described in the description of FIGS. 4 and 5.

In step 615, ultrasonic vibration 145 is applied to the solder 130 to cause the solder 130 to reflow on to contacts, e.g. pads 120, on the substrate 125 in step 620.

After cooling in step 625, the solder contacts 625 are formed and electrically and physically attached to the substrate 125.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An apparatus for transferring solder to a substrate comprising:
    a substrate belt capable of moving one or more substrates in a belt direction;
    a decal having one or more through holes in a hole pattern, each of the holes having a solder volume capable of holding a solder; and
    an ultrasonic head capable of producing an ultrasonic vibration in a longitudinal direction, the longitudinal direction being perpendicular to the belt direction, where the ultrasonic head and substrate can be moved together in the longitudinal direction to maintain the ultrasonic head in contact with the solder while applying the ultrasonic vibration.

2. An apparatus, as in claim 1, where the ultrasonic head can move in the longitudinal direction toward the substrate belt and cause the decal to be in contact with one or more of the substrates and move away from the substrate belt and cause the decal not to be in contact with the substrates.

3. An apparatus, as in claim 1, further comprising a pressure plate below the substrate belt.

4. An apparatus, as in claim 1, where the pressure plate can move in the longitudinal direction toward the substrate belt to put the ultrasonic head and the substrate in contact with the decal and move away from the substrate belt and disengage the ultrasonic head from contacting the decal.

5. An apparatus, as in claim 3, where the pressure plate can provide heat.

6. An apparatus, as in claim 1, where the substrate belt can provide heat to one or more of the substrates.

7. An apparatus, as in claim 1, where a heating mechanism provides heat at two or more regions along the substrate belt.

8. An apparatus, as in claim 7, where the heating mechanisms include: an increase to ambient temperature, a heating of the substrate belt, and a heating of one or more pressure plates.

9. An apparatus, as in claim 1; further comprising a heating mechanism that provides heat to one or more substrates while applying the ultrasonic vibration.

10. An apparatus for transferring solder to a substrate comprising:
    a substrate belt capable of moving one or more substrates in a belt direction;
    one or more pressure plates below the substrate belt;
    a decal having one or more through holes in a hole pattern, each of the holes having a solder volume capable of holding a solder; and
    an ultrasonic head capable of producing an ultrasonic vibration in the solder in a longitudinal direction, the longitudinal direction being perpendicular to the belt direction, where the ultrasonic head and one of the pressure plates can be moved together in the longitudinal direction to maintain the ultrasonic head in contact with the solder while applying the ultrasonic vibration.

11. An apparatus, as in claim 10, further comprising a compliant layer of material attached to the bottom of the ultrasonic head.

12. An apparatus, as in claim 10, where the solder is one or more of the following compositions: lead-tin, In, Sn, InSn, InBiSn, SnBi, InAg, SnCu, SnAg, SnAgCu, and SnPb.

* * * * *